US010008314B2

(12) United States Patent
Batz et al.

(10) Patent No.: US 10,008,314 B2
(45) Date of Patent: Jun. 26, 2018

(54) ELECTRIC COIL, APPARATUS HAVING AT LEAST TWO SUBCOILS AND MANUFACTURING METHOD THEREFOR

(71) Applicant: Siemens Aktiengesellschaft, Munich (DE)

(72) Inventors: Otto Batz, Leutenbach (DE); Dietmar Bayer, Heroldsbach (DE); Michael Frank, Uttenreuth (DE); Peter van Hasselt, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 568 days.

(21) Appl. No.: 14/737,968

(22) Filed: Jun. 12, 2015

(65) Prior Publication Data
US 2017/0084371 A1    Mar. 23, 2017

(30) Foreign Application Priority Data
Jun. 13, 2014   (DE) .......................... 10 2014 211 316

(51) Int. Cl.
*H01F 1/00* (2006.01)
*H01F 6/06* (2006.01)
(Continued)

(52) U.S. Cl.
CPC .......... *H01F 6/06* (2013.01); *G01R 33/34023* (2013.01); *G01R 33/381* (2013.01);
(Continued)

(58) Field of Classification Search
CPC .......... H01F 6/06; H01F 41/048; H01F 41/12; G01R 33/34023
(Continued)

(56) References Cited

U.S. PATENT DOCUMENTS 4,746,866 A * 5/1988 Roschmann ..... G01R 33/34046
324/318
5,793,210 A * 8/1998 Pla ..................... G01R 33/3854
324/318
(Continued)

FOREIGN PATENT DOCUMENTS

DE  102010042598 A1  4/2012
DE  102012217990 A1  4/2014

OTHER PUBLICATIONS

Kosa et al., "Application Possibilities with Continuous YBCO Loops Made of HTS Wire," Journal of Physics: Conference Series, Institute of Physics Publishing, Bristol, vol. 234, No. 3 (2010), pp. 1-12.

*Primary Examiner* — Shawki S Ismail
*Assistant Examiner* — Lisa Homza
(74) *Attorney, Agent, or Firm* — Schiff Hardin LLP

(57) ABSTRACT

An electric coil apparatus has at least two subcoils from a superordinate doubly connected tape conductor. The coil apparatus has at least two conductor branches, each of the subcoils being wound from one of these conductor branches respectively. The conductor branches of the superordinate tape conductor have a superordinate first surface and a superordinate second surface facing away from this first surface. In a first subcoil, the first surface of the tape conductor faces a centerpoint of the first subcoil, and in a second subcoil, the second surface of the tape conductor faces a centerpoint of the second subcoil. Furthermore, in a manufacturing method of such a coil apparatus the two conductor branches are routed parallel to each other so as to dorm the subcoils.

19 Claims, 5 Drawing Sheets

(51) Int. Cl.
G01R 33/381 (2006.01)
G01R 33/34 (2006.01)
H01F 41/04 (2006.01)
H01F 41/12 (2006.01)
G01R 33/3815 (2006.01)

(52) U.S. Cl.
CPC .......... H01F 41/048 (2013.01); H01F 41/12 (2013.01); *G01R 33/3815* (2013.01)

(58) Field of Classification Search
USPC ........................................................ 335/216
See application file for complete search history.

(56) References Cited

U.S. PATENT DOCUMENTS

| | | | | |
|---|---|---|---|---|
| 6,078,234 A * | 6/2000 | Huang | ................... | B82Y 15/00 |
| | | | | 324/319 |
| 6,344,704 B1 * | 2/2002 | Hansen | ................... | H02K 3/26 |
| | | | | 310/248 |
| 2002/0096644 A1 * | 7/2002 | Simizu | ................... | G21K 1/093 |
| | | | | 250/492.1 |
| 2005/0229712 A1 * | 10/2005 | Baudendistel | ............ | G01L 9/16 |
| | | | | 73/722 |
| 2008/0207458 A1 | 8/2008 | Hong et al. | | |
| 2009/0206968 A1 | 8/2009 | Hussennether et al. | | |
| 2015/0115765 A1 * | 4/2015 | Ko | ......................... | H02K 3/522 |
| | | | | 310/215 |
| 2015/0318099 A1 * | 11/2015 | Frank | ...................... | H01F 6/065 |
| | | | | 505/211 |
| 2016/0064128 A1 * | 3/2016 | Kummeth | ................. | H01F 6/06 |
| | | | | 505/211 |
| 2016/0118172 A1 * | 4/2016 | Batz | ......................... | H01F 6/06 |
| | | | | 505/211 |
| 2017/0117095 A1 * | 4/2017 | Batz | ..................... | H01F 41/048 |

\* cited by examiner

ELECTRIC COIL, APPARATUS HAVING AT LEAST TWO SUBCOILS AND MANUFACTURING METHOD THEREFOR

BACKGROUND OF THE INVENTION

Field of the Invention

The invention concerns an electric coil apparatus of the type having at least two subcoils made of a superordinate doubly-connected tape conductor, the tape conductor having at least two conductor branches and the subcoils each being wound from one of these conductor branches.

Description of the Prior Art

Superconducting coils are used to generate strong, homogeneous magnetic fields, with the superconducting coils being operated in sustained short-circuit current mode. Homogeneous magnetic fields with magnetic flux densities between 0.5 T and 20 T are needed, for example, for nuclear magnetic resonance spectroscopy (NMR spectroscopy) and for magnetic resonance imaging. These magnets are typically charged via an external current circuit and are then separated from the external power source as, in the resulting sustained short-circuit current mode, an almost loss-free current flow occurs via the superconducting coil. The resulting strong magnetic field is particularly stable over time as it is not affected by the noise contributions of an external current circuit.

Where known winding technologies are used, one or more superconducting wires are wound on supporting bodies, different wire segments being linked to one another via wire connections with optimally low ohmic resistance or via superconducting connections. For classic low-temperature superconductors such as NbTi and $Nb_3Sn$ with transition temperatures below 23 K, technologies exist for manufacturing superconducting contacts for linking wire segments and for connecting windings to a superconducting sustained current switch. The superconducting sustained current switch is thereby part of the current circuit of the coil and is placed in a resistive conducting state by heating, in order to feed in an external current. After switching off the heating and cooling down to the operating temperature, this part of the coil also becomes superconducting again.

High-temperature superconductors, also called high-$T_c$ superconductors (HTS), are superconducting materials with a transition temperature above 25 K, and above 77 K in some material classes such as cuprate superconductors, in which the operating temperature can be achieved by cooling with cryogenic materials other than liquid helium. HTS materials are particularly attractive for the manufacture of magnetic coils for NMR spectroscopy and magnetic resonance imaging, as some materials have high upper critical magnetic fields of over 20 T. Due to the higher critical magnetic fields, the HTS materials are in principle more suitable than the low-temperature superconductors for generating high magnetic fields of, for example, over 10 T.

A problem in the manufacture of HTS magnetic coils is the lack of suitable technologies for the manufacture of superconducting HTS connections, in particular, for second-generation HTS, known as 2G-HTS. The 2G-HTS wires occur typically in the form of flat tape conductors. If resistive contacts are inserted between the superconducting tape conductors the losses in the coil can no longer be ignored, and the generated magnetic field drops off noticeably over a period of a few hours or days.

In DE 10 2010 042 598 A1, a superconducting MR magnet arrangement is described that has a superconducting tape conductor that is provided in the longitudinal direction with a slit between the two ends such that the superconducting tape conductor forms a closed loop enclosing the slit. In the magnet arrangement, the superconducting tape conductor is wound on at least one double coil made of two subcoils which are arranged rotated relative to one another such that they generate a predetermined magnetic flux in a measurement volume.

A method for manufacturing a coil with a slitted tape conductor is also disclosed in the non-prepublished German patent application under file number 102013207222.8. Here, the two conductor branches of the tape conductor are simultaneously wound on two adjacent parts of a winding support.

In these known coil apparatuses with slitted, doubly connected tape conductors, the two subcoils are wound simultaneously, such that the corresponding superordinate surfaces of the superordinate tape conductor are oriented radially in the same direction. Thus, a superordinate surface of the tape conductor is either oriented uniformly toward the coil interior via a pair of simultaneously wound subcoils or uniformly toward the coil exterior. By means of this uniformly directed and simultaneous winding of the two subcoils, the individual conductor branches can be routed adjacent to one another during winding without any significant torsion of the tape conductor. If after winding the subcoils are arranged relative to one another such that their common magnetic fields reinforce one another, they have to be turned counter to one another so that significant torsion then occurs at least locally in sub-areas of the conductor branches. A disadvantage in these known coil apparatuses is thus that the conductor branches are twisted in places when the finished coil apparatus is operated. This causes a mechanical straining of the conductor branches during operation, which can lead to impairment of the quality of the superconducting layer. In order, as far as possible, to prevent any such impairment of the superconductor, additional space is required for the protruding ends of the conductor branches, as the strain due to the twisting can be alleviated if the torsion extends over a longer section of the conductor. This additional space requirement is, however, also disadvantageous, as coil arrangements for electric coil apparatuses are generally supposed to be of as compact a design as possible.

SUMMARY OF THE INVENTION

An object of the invention is to provide an electric coil apparatus having at least two subcoils made of a superordinate doubly connected tape conductor which avoids the disadvantages noted above. In particular, a coil apparatus will be described in which the individual conductor branches of the tape conductor are twisted as little as possible during operation of the coil apparatus. A further object of the invention is to describe a manufacturing method for such a coil apparatus.

The electric coil apparatus according to the invention has at least two subcoils made of a superordinate doubly connected tape conductor that has at least two conductor branches, each of the subcoils being wound from one of these conductor branches respectively. The conductor branches of the superordinate tape conductor thus have a superordinate first surface and a superordinate second surface facing away from this first surface. In a first subcoil the first surface of the tape conductor faces a centerpoint of the first subcoil, and in a second subcoil the second surface of the tape conductor faces a centerpoint of the second subcoil.

In other words, the at least two subcoils are formed such that the orientation of the superordinate tape conductor surface with respect to the centerpoint of the respective subcoil differs within such a pair. This opposing orientation of this at least one pair of subcoils initially inevitably allows for a more unfavorable geometric progression in the winding of the subcoils. For in order to achieve the opposing orientation of the superordinate surfaces when manufacturing the subwindings, the at least two conductor branches must be twisted counter to one another in their end regions. In an arrangement of the subcoils for the final coil apparatus, however, the individual subcoils of this pair can then be oriented counter to one another such that this torsion is largely eliminated and the conductor branches of the tape conductor are twisted only slightly in the finished coil apparatus and during its operation. This can achieve an improved service life and/or improved electrical properties of the tape conductor during operation of the coil apparatus. Furthermore, such an arrangement can reduce the space required for the end regions of the doubly connected tape conductor.

The method according to the invention for the production of an electric coil apparatus having at least two subcoils made of a superordinate doubly connected tape conductor, the tape conductor having at least two conductor branches, includes the following steps:
  arrangement of the conductor branches such that they are routed parallel alongside one another at least in an area adjacent to a first conductor end, the orientation of the two surfaces of the superordinate tape conductor being different for at least two of the conductor branches,
  formation of the at least two subcoils by winding the at least two conductor branches, starting from the area adjacent to the first conductor end, and
  arrangement of the at least two subcoils such that magnetic fields generated by them when a current flows through the common tape conductor mutually reinforce one another.

The advantages of the manufacturing method according to the invention are a similar manner to the advantages of the coil apparatus according to the invention. In particular, with this manufacturing method, the opposing orientation of the surfaces of the conductor branches in the winding of the subcoils can largely reduce any torsion of the conductor branches in the finished coil apparatus.

With respect to the arrangement of the two conductor branches with opposing orientation of the superordinate surfaces prior to winding, it is useful if at least one of the conductor branches is twisted in its end regions about its longitudinal axis. Alternatively, such twisting may also extend across both conductor branches, for example each of the conductor branches may be twisted in one of the end regions, or the twisting may extend in the end regions across both conductor branches. In each case, torsions must be introduced at two points in the region of the connected conductor ends in order to achieve the desired relative orientation of the surfaces.

When arranging the at least two subcoils to form the superordinate magnetic field, the subcoils can then advantageously be turned counter to one another such that the described twists in the region of the conductor ends are at least to a large extent reversed again. In this way, it can be achieved that in the finished coil apparatus there is only a slight torsion of the conductor branches of the tape conductor.

The subcoils of the coil apparatus may each be embodied as flat disc windings. In this embodiment, any torsion of the respective conductor branch within the individual subcoils can advantageously be avoided, as the conductor branches are then bent only within the respective associated winding planes, but are not twisted out of this winding plane. In other words, within each disc winding the normals of the planes of the individual conductor branches always run within the winding planes. The at least two disc windings may thereby advantageously each have a base area with at least two-fold rotational symmetry. Base areas in the shape of a circle, an ellipse, an oval, a racetrack geometry or a rectangle with rounded corners are particularly advantageous. The effect of such a symmetrical structure is that, after joint parallel winding, two such subcoils may be arranged again in the finished coil apparatus adjacent to one another on a common base area.

The subcoils of the coil apparatus may each have a plurality of windings of the respective conductor branches lying on top of one another, whereby in the first subcoil for all windings the first surface of the tape conductor faces the centerpoint of the first subcoil and in the second subcoil for all windings the second surface of the tape conductor faces a centerpoint of the subcoil. In particular, each of the subcoils may have a multiplicity of such windings lying on top of one another in order to generate a strong superordinate magnetic field in the coil apparatus. If as described, the orientation of the surfaces of the conductor branch within a subcoil does not change, then any torsion of the conductor branches can be completely avoided at least within each of the subcoils.

The coil apparatus may have a central system axis. This system axis may for example be an axis of symmetry of a magnetic field formed during operation of the coil apparatus. If the subcoils are flat disc windings, the system axis in the finished coil apparatus may lie in particular perpendicular to the winding planes of the subcoils.

The conductor branches of the tape conductor may be arranged such that their local surfaces at no point form an angle of 90° to the system axis. In other words, the tape conductor is at no point twisted fully about its longitudinal axis, as for such a full twist it would be necessary for the tape conductor to stand at some point in the system perpendicular to the system axis, in order to turn its orientation relative to the system axis. If this is at no point the case, then the possibility of a full twist of the tape conductor in the finished coil apparatus is excluded, and the tape conductor is under less mechanical strain when the coil apparatus is in operation.

The conductor branches of the tape conductor may advantageously be arranged such that their local surfaces at no point form an angle of more than 45° to the system axis. They may even be arranged such that their local surfaces at no point form an angle of more than 30° to the system axis. In these two advantageous embodiments, there is thus a substantially lower torsion of the conductor branches of the tape conductor. The conductor branches are routed substantially untwisted within planes which lie perpendicular to the system axis. A slight twist may be necessary only in the end regions in which the conductor branches are connected. Particularly in the end region in which the tape conductor is routed from the coil interior of a first subcoil around the second subcoil to the coil interior thereof, slight torsion of the conductor material cannot be completely avoided. Advantageously, however, this torsion lies below the stated angular range, so any straining of the conductor materials by significant twisting can be, to a large extent, avoided.

The coil apparatus may have a winding support composed of least two parts, each part supporting one of the subcoils and each part being furnished with a slit-shaped recess for introducing a first conductor end of the tape conductor. Each of the subcoils can advantageously be fixed mechanically by such a winding support during production of the windings. In addition, the subcoils can be wound on the adjacent parts of the winding support in particular simultaneously. The use of a winding support comprising at least two parts makes it possible to orient the subcoils relative to one another flexibly such that they generate a desired magnetic field. Mutual reinforcement of the magnetic fields can be achieved after the joint winding by rotating the subcoils in opposing directions to one another.

The slit-shaped recesses of the parts of the winding support may be embodied and oriented relative to one another such that a superordinate slit-shaped recess over the entire winding support is produced. If an inner end region of the tape conductor is introduced into this slit-shaped recess prior to the winding of the subcoils, the subcoils can be wound onto the support parts without substantially impeding the flexibility of the conductor branches in this inner end region. The flexibility of the two end pieces of the doubly connected tape conductor only makes subsequent alteration of the relative orientation of the subcoils possible after the winding.

Since the insertion of a tape conductor which is twisted in its end region into the superordinate slit-shaped recess of the winding support is difficult and/or may strain the tape conductor by buckling, "introduction" of the end region should also be understood to include a lateral arrangement of the parts of the winding support around the conductor end of the tape conductor.

In addition to the parts of the winding support which support the respective subcoils, the winding support may also be furnished with further center pieces and/or axial end pieces which may assist with routing of the conductor branches of the tape conductor, for example within their winding planes running parallel to one another. These center and/or end pieces may either be rigidly connected to the parts supporting the winding or be connected to them subsequently, for example, after an inner conductor end has been positioned in the slit-shaped recess.

The at least two parts of the winding support may be connected or connectable to one another such that the superordinate winding support can be rotated together about a superordinate winding axis during manufacture of the windings. The connection may be implemented for example as a push-in connection, as a bonded connection or as a mechanical fixing on a common holder. Any connecting pieces that there may be are advantageously arranged on the inside of the annular parts. The connection of the two parts is usefully designed such that it can easily be detached without damaging any coil winding mounted on the winding support through application of excessive force. For example, a predetermined breaking point may be provided between the two connected parts.

The doubly connected tape conductor may be a slitted tape conductor with a continuous superconducting layer. The superconducting layer is particularly advantageously a layer of a high-temperature superconductor, in particular of a compound of the type $REBa_2Cu_3O_x$, where RE stands for a rare-earth element or a mixture of such elements. Alternatively, the superconducting layer may for example comprise magnesium diboride. The continuous superconducting layer is superconductively connected over the entire connected loop without any link to a resistive contact existing.

In a particularly advantageous embodiment, a connected conductor can be provided for a magnetic coil operated in sustained-current mode.

At least two subcoils of the coil apparatus can be oriented relative to one another such that magnetic fields generated when as current flows through the common tape conductor mutually reinforce one another. This is particularly useful when used as a magnetic coil, as the magnetic fields of the subcoils must then at least not fully offset one another. In a particularly advantageous embodiment, reinforcement of the magnetic fields can be achieved by turning one subcoil around against the other such that after the turning the subcoils are again arranged about a common axis of symmetry.

In an embodiment with more than two subcoils, the magnetic fields of all the subcoils do not necessarily have to mutually reinforce one another. It is essential that at least one pair of subcoils exists for which that is the case. Further subcoils may also be oriented such that their magnetic fields are offset at least partially by other adjacent subcoils, for example in order to achieve a more complex and/or a particularly homogeneous superordinate flux. This may be particularly appropriate for subcoils located further outward relative to the system axis.

The subcoils may each have a plurality of windings of the respective conductor branches lying on top of one another, an electrically insulating layer being arranged between adjacent windings in each case. Such an insulating layer may, for example, already be part of the layer structure of the tape conductor. Alternatively or additionally, a further insulating tape may be arranged between the windings of the tape conductor. A further option is to wrap the individual conductor branches of the tape conductor with an insulating tape, as a result of which a prefabricated insulated winding tape can also be produced.

The doubly connected tape conductor may be divided by more than one slit into more than two conductor branches, each of the conductor branches being wound to a subcoil of the coil apparatus, and at least one pair of these subcoils differing with regard to the orientation of the superordinate surfaces of the tape conductor relative to the centerpoint of the respective subcoil. Advantageously, each of the subcoils may then also be arranged on a part of a winding support, for example such parts may in each case be connected or be connectable in pairs to a superordinate support structure. The subcoils of the coil apparatus can then advantageously always be wound simultaneously to one another in pairs.

The conductor branches of the tape conductor can differ in width from one another. With this embodiment, subcoils with differing current-carrying capacity can be formed, for example for adapting to local magnetic fields in a magnetic resonance device, for generating predefined inhomogeneous magnetic field distributions and/or for maximizing the overall current depending on local circumstances in a complex coil system consisting of multiple magnetic coils.

In the method for the manufacture of the electric coil apparatus, before the winding of the conductor branches, a first conductor end of the superordinate tape conductor can be introduced into at least one slit-shaped recess of the winding support. Each of the subcoils can then be formed by winding a conductor branch onto an assigned part of the winding support.

Prior to the winding of the subcoils, the tape conductor may be impregnated with an impregnating agent, which is cured after the subcoils have been manufactured. In other words, the coil winding may be manufactured in a process known as a wet winding process. Through the curing of the impregnating agent, the coil winding then obtains its mechanical strength. In this embodiment, it is advantageous if the inner and/or outer end regions are not also impregnated or at least not cured so that the end regions remain freely movable and the subcoils may as a result continue to be moved in opposite directions to one another.

As an alternative or in addition to impregnating, the subcoils of the coil winding may be sealed with a sealing agent, the sealing agent also being curable. Such sealing may be carried out before or after the final orientation of the subcoils relative to one another. If the sealing is carried out directly after the winding of the subcoils, then it is advantageous if the end regions of the tape conductor are not also sealed, but remain as freely movable as possible.

The at least two subcoils can in a preferable embodiment be wound simultaneously. If there are more than two subcoils, these subcoils can advantageously be wound with one another in pairs simultaneously in each case. This can usefully be carried out such that for each pair of subcoils a constantly equal number of windings is produced. In this way, a particularly symmetrical magnetic field can advantageously be achieved with the superordinate coil apparatus.

The slitted, doubly connected tape conductor can be manufactured even before commencing winding of the subcoils by slitting a singly connected tape conductor. For example, the doubly connected tape conductor may be located already slitted on a supply spindle and a pair of supply spindles and for example be rewound from here onto the winding support or supports.

Alternatively, the singly connected tape conductor may also be present on a supply spindle before the start of the manufacturing process. The beginning of a slit can then initially be formed adjacent to an end region, and the winding of the subcoils can begin. In this embodiment of the method, the continuation of the slit can then be made during the winding of the subcoils. The slitting of the tape conductor can generally be done for example with the aid of a laser or a saw or by waterjet cutting.

DESCRIPTION OF THE PREFERRED EMBODIMENTS

Figure 1:
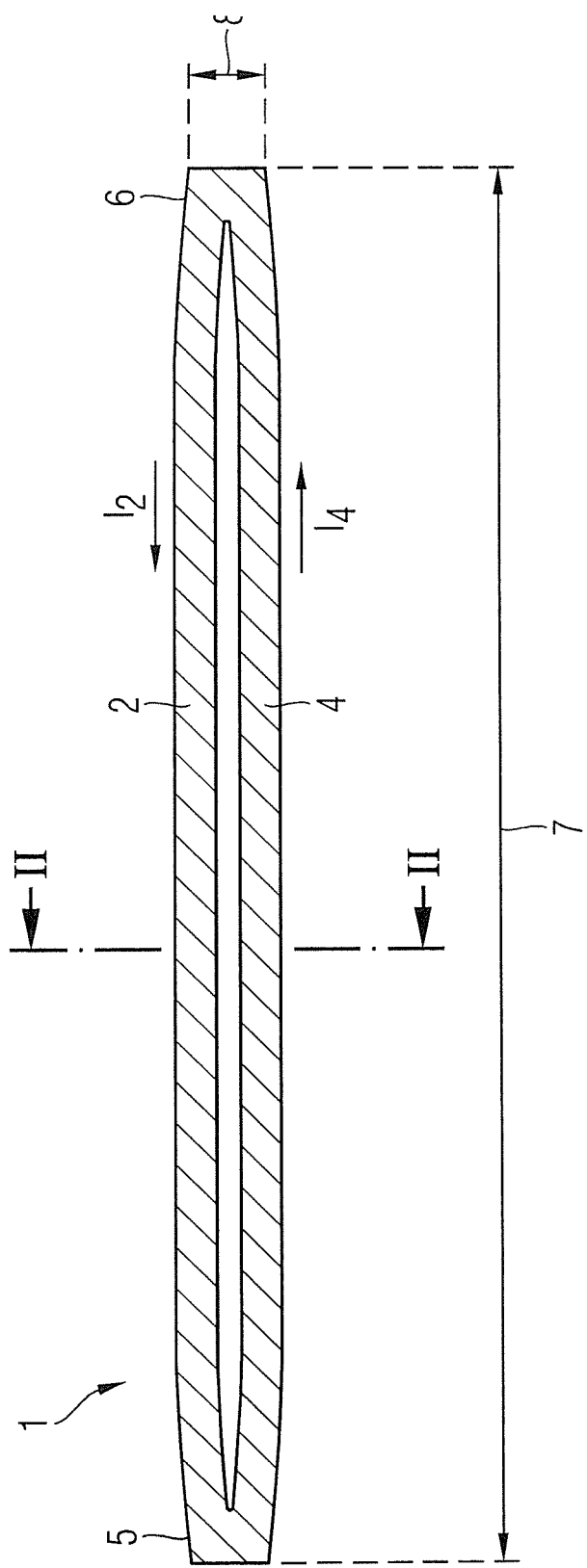
FIG. 1 is a schematic top view of a superconducting tape conductor with a doubly connected topology.

FIG. 1 shows the schematic top view of a superconducting tape conductor with a doubly connected topology, which is manufactured by slitting a singly connected superconducting tape conductor. In this example, the slitting is carried out by a laser.

A first exemplary embodiment of the invention is a magnetic coil for NMR spectroscopy. In this example, the length 7 of the originally singly connected tape conductor is 1000 m. This length may, however, also be substantially shorter or longer. In a magnetic coil for magnetic resonance imaging, the length may be a multiple of the length described here. The superconducting tape conductor comprises two approximately equally dimensioned conductor branches 2 and 4. A current $I_2$ flows through the first conductor branch 2, and a current $I_4$ flows in the opposite direction through the second conductor branch, so that a closed ring current flows through the entire doubly connected superconducting tape conductor 1. The width 8 of the original, singly connected tape conductor is in this example 10 mm, and the width of the two conductor branches 2 and 4 is in the slitted region 5 mm respectively. Depending on the tape conductor material used, this width of the conductor branches 2, 4 may, however, also be substantially greater or smaller, in particular, the tape conductor 1 may also be divided asymmetrically. In the region of the two conductor ends 5 and 6, the two conductor branches 2 and 4 remain connected.

Figure 2:
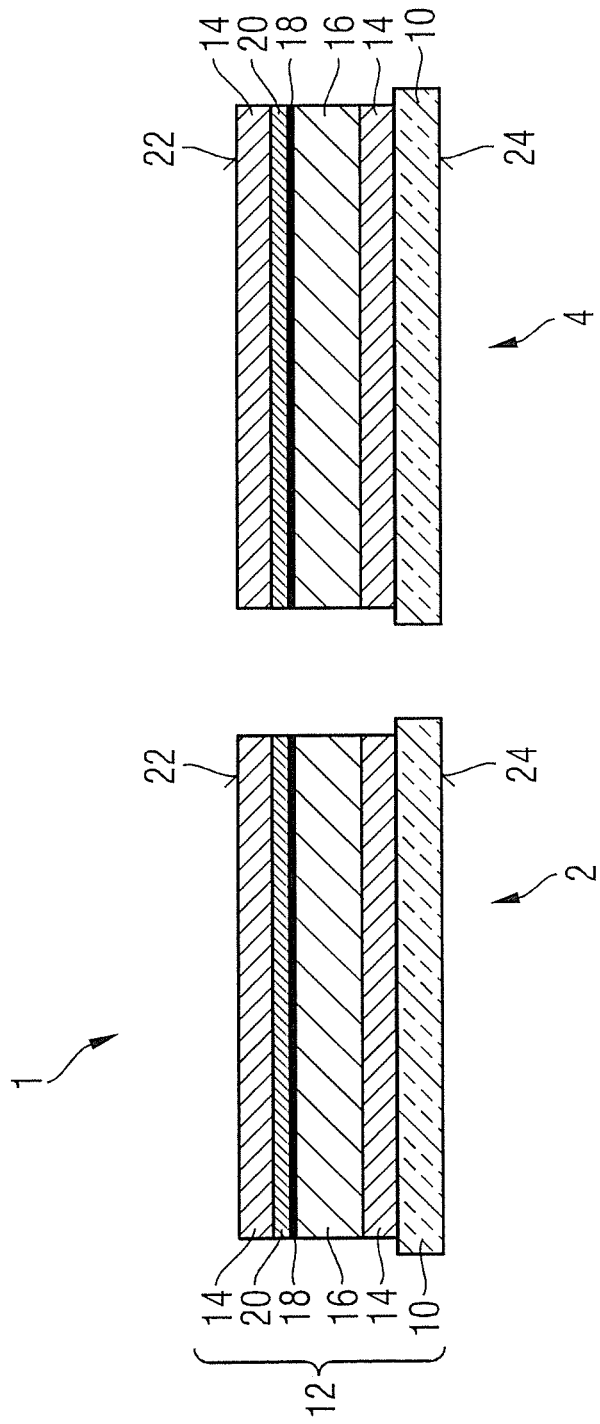
FIG. 2 shows a cross section of the superconducting tape conductor according to the sectional plane II in FIG. 1.

FIG. 2 shows an exemplary cross section of a superconducting tape conductor comprising a second-generation high-temperature superconductor, in which the layer structure is represented schematically. In this example, the superconducting tape conductor 1 comprises an insulating layer 10, with which it is firmly connected to a winding tape 12. The insulating layer 10 is in this example a 50 μm thick Kapton tape, but it may also be constructed from other insulating materials such as, for example, other plastics. The also doubly connected winding tape 12 comprises the two adjacent conductor branches 2 and 4, it being possible for the entire winding tape 12 to be rolled with these adjacent conductor branches 2 and 4 on a supply roller (not shown here), and for the coil apparatus to be manufactured by unwinding the doubly connected winding tape 12 from the supply roller. The layer structure of each conductor branch 2, 4 has above the insulating layer 10, firstly a normally conducting covering layer 14, which in this example is a 20 μm thick copper layer. This is followed by the carrier tape 16, which here is a 50 μm thick substrate made of a nickel-tungsten alloy. Steel tapes or tapes made of an alloy such as e.g. Hastelloy can also be used. Above the carrier tape 16 a 0.5 μm thick buffer layer 18 containing the oxidic materials $CeO_2$ and $Y_2O_3$ is arranged. Above this follows the actual superconducting layer 20, here a 1 μm thick layer made of $YBa_2Cu_3O_x$, which in turn is covered with a 20 μm thick covering layer 14 made of copper. The superconducting layer 20 forms a continuous layer across the entire doubly connected topology. In the example shown, in each conductor branch 2, 4 the width of the insulating layer 10 is somewhat greater than the width of the remaining layers 14 to 20, so that conductor branches 2, 4 that come to lie on top of one another in a winding of the coil apparatus are reliably insulated from one another. As an alternative to the example shown, insulating layers 10 can also be arranged on both sides of the superconducting tape conductor 1, or the lateral regions of the superconducting tape conductor 1 can also be protected by insulating layers. It is possible furthermore for an insulating layer to be woven as a separate tape into the coil apparatus during manufacture of the coil winding.

Figure 3:
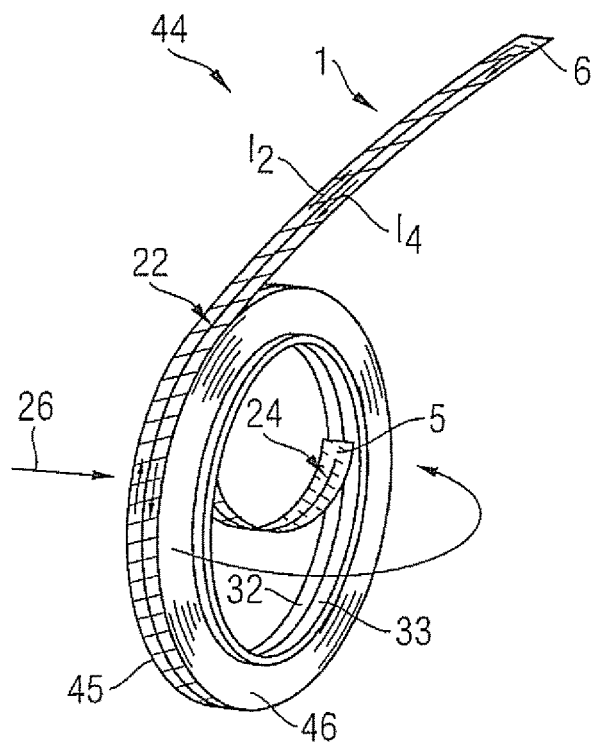
FIG. 3 shows a schematic three-dimensional view of two wound subcoils according to the prior art.

FIG. 3 shows a schematic three-dimensional view of a wound electric coil with two subcoils according to the prior art which run parallel and are oriented in the same direction. In FIG. 3, the greater part of the tape conductor 1 is wound in the form of a double coil onto the winding support 22 such that, besides the two conductor ends 5 and 6, only a small unwound subsection of the tape conductor in each case remains outside the windings of the coil winding. Through simultaneous rotation of the two parts 23, 24 about the winding axis 26, two symmetrical subcoils 45 and 46, whose winding planes lie parallel to one another and which are arranged closely adjacent, have formed on the winding support 22. In the subcoils 45 and 46 shown, the same sides of the superordinate tape conductor 1 are oriented toward the interior of the coil. Correspondingly, the conductor branches 2 and 4 of the subcoils 45 and 46 are routed parallel adjacent to one another for their entire length and are thereby essentially not twisted in themselves.

If a ring-shaped current were to flow through the doubly connected tape conductor 1, an opposing current flow $I_2$, $I_4$ through the two conductor branches 2 and 4 would take place. The magnetic fields generated as a result would thus have opposing field directions. In order to generate magnetic fields that mutually reinforce one another, based on the arrangement in FIG. 3, the subcoils 45 and 46 have to be twisted against to one another.

Figure 4:
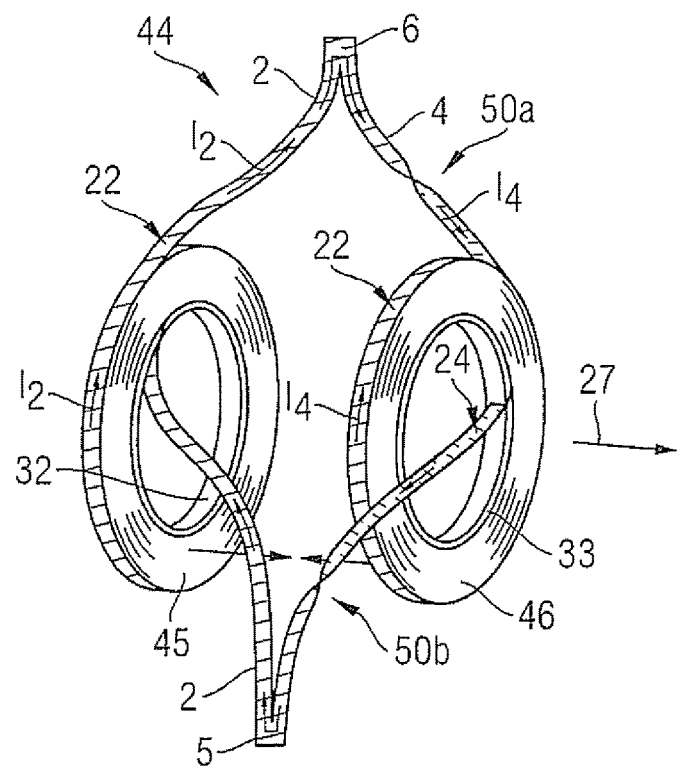
FIG. 4 shows a schematic view of the arrangement of the subcoils in a coil apparatus according to the prior art.

FIG. 4 shows schematically an arrangement of an electric coil 44 according to the prior art, in which the subcoil 46 has been rotated in the opposite direction to the subcoil 45 such that now a current flow I2 and I4 in the same direction is achieved, and the magnetic fields of the subcoils 45, 46 mutually reinforce one another. To do this, the tape conductor 1 must be twisted in the region of the conductor ends 5, 6 at at least two points 50a and 50b about its local longitudinal axis. This torsion of the conductor branches is constantly present during operation of the electric coil apparatus 44 and can in the medium term result in damage to the superconducting material. In order to minimize the negative influence of the torsion, it may, for example, also be necessary to choose a length of the internally and externally protruding conductor ends that is greater than would for other reasons be necessary. This excess conductor material leads to an increased spatial requirement of the coil apparatus in a radial direction and simultaneously reduces the proportion of the length of the strip conductor that is available for generating a magnetic field.

Figure 5:
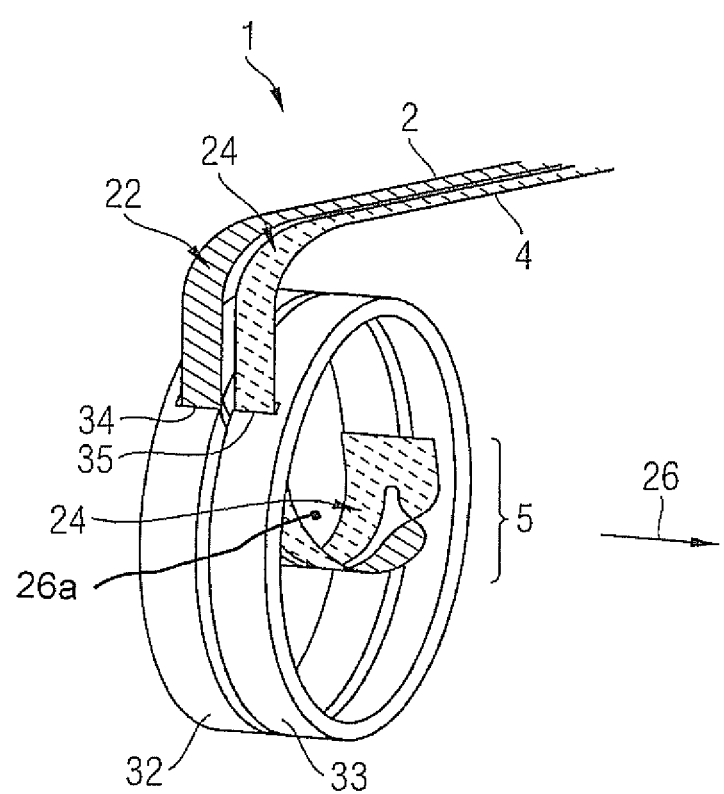
FIG. 5 shows a schematic representation of a substep of the manufacturing method according to an exemplary embodiment of the invention.

FIG. 5 shows a schematic representation of a substep of the manufacturing method according to a first exemplary embodiment of the invention. It shows one conductor end 5 of a tape conductor and an area adjacent thereto, the two conductor branches' 2 and 4 of the tape conductor being routed next to one another in this adjacent area such that the orientation of the two surfaces 22 and 24 of the superordinate tape conductor is different. To achieve this here, one of the two conductor branches 4 is rotated near the conductor end 5 once by approximately 180° about its longitudinal axis. The pair of conductor branches 2 and 4 arranged next to one another in this way has in an area adjacent to its conductor end 5 been introduced into the interior of a winding support. This winding support comprises two symmetrical parts 32 and 33 with slit-like recesses 34 and 35, which together form a continuous slit extending over both parts 32 and 33. In order to prevent damage to the material of the tape conductor 1, the introduction of the conductor end 5 can be carried out such that the two parts 32 and 33 of the winding support are placed from opposing sides around this end region and are then connected, for example mechanically, to a superordinate winding support. Thus, for the coil wound on part 32, the surface 22 faces the center point 26a, through which a winding axis 26 proceeds, and for the coil wound on the part 33, the surface 24 faces the center point 26a.

The two parts 32, 33 are arranged laterally offset in relation to the winding axis 26 and are connected to one another mechanically such that they can be rotated together about the winding axis. In the subsequent steps of the manufacturing method, two subcoils 45 and 46 of the coil apparatus can be, through such a rotation, wound simultaneously and with same number of windings. To do this, the tape conductor 1 can either be slitted along its entire length 7 in advance, or alternatively the slit can be made, at least on a part of the length 7, only during the winding of the subcoils 45 and 46.

Figure 6:
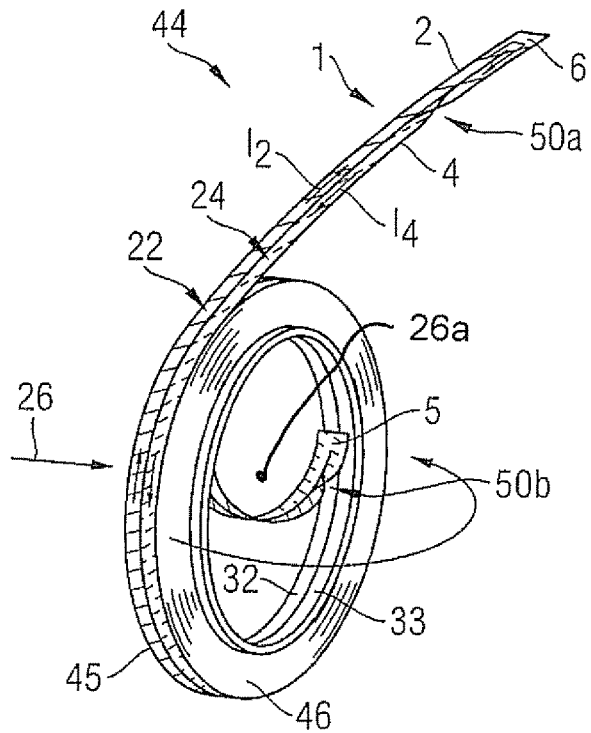
FIG. 6 is a schematic three-dimensional view of two wound subcoils according to an exemplary embodiment of the invention and FIG. 7 is a schematic view of the arrangement of the subcoils in an exemplary embodiment of a coil apparatus.

FIG. 6 shows a schematic three-dimensional view of two wound subcoils 45 and 46 according to an exemplary embodiment of the invention. This may, for example, be two subcoils, as can be manufactured in a winding step subsequent to the step in FIG. 5. In contrast to FIG. 3, however, here a first superordinate surface 22 is oriented such that in one subcoil 45 it is arranged on a radially external side of the windings (so the other surface 24 faces the center point 26a) and in the other subcoil 46 it is arranged on a radially internal side of the windings (so that surface 22 faces the center point 26a). In order to achieve this turned-against-one-another arrangement, the conductor branch 4 shown on the right in FIG. 6 is rotated at two twists 50a and 50b about its longitudinal axis, once in the region of its outer conductor end 6 and once in the region of its inner conductor end 5. In comparison to the arrangement shown in FIG. 3, this leads to a short-term additional torsional loading of the tape conductor 1 during the winding step.

Figure 7:
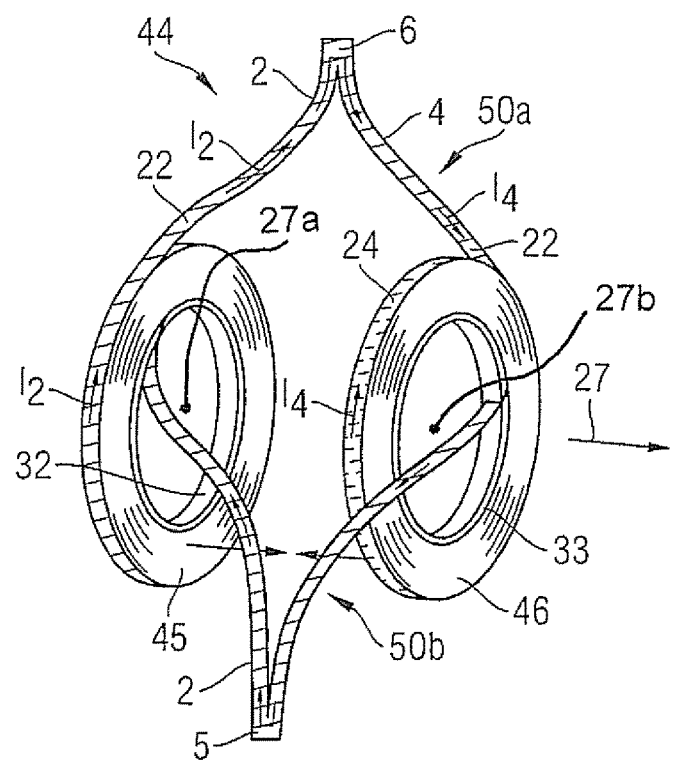

FIG. 7 shows a schematic view of a coil apparatus 44 with the subcoils 45 and 46 after the method step of arranging the subcoils such that magnetic fields generated by them when a current flows through the common tape conductor mutually reinforce one another. To achieve this, in comparison to FIG. 6, the subcoil 46 was turned by approx. 180° against the subcoil 45 such that the currents I2 and I4 in the two conductor branches now flow in the same direction in the adjacent subcoils. Again, the surface 24 faces the center point 27a of subcoil 45, and the surface 24 faces the center point 27b of sub coil 46. The turning of the subcoil 46 was executed such that the twists 50a and 50b in the region of the conductor ends, shown in FIG. 6, to a large extent offset one another. By this means, a coil apparatus 44 is produced in which the conductor branches 2 and 4 are twisted only negligibly over their entire length range. Only in the regions adjacent to the conductor ends 5 and 6 is there still a small residual torsion, as a small axial distance between the two subcoils has to be bridged and the tape conductor has to be routed in an area adjacent to the inner conductor end 5 out of the interior of the subcoil 45 around a part of the second subcoil 46 and into the coil interior thereof.

For generating very high magnetic fields, as high as possible a packing density of individual coil windings along a system axis 27 is desirable. In the electric coil 44, the minimum distance between the two subcoils 45 and 46 is determined by the fact that in the region of the inner tape conductor end 5 a conductor branch 2 has to proceed between the two subcoils 45, 46. Depending on the orientation of this section of the conductor branch 2, a minimum distance between the two subcoils 45, 46 is thus determined by the width and/or thickness of a conductor branch 2. The subcoils 45 and 46 may thus also be arranged substantially nearer to one another than indicated in FIG. 7.

The free conductor ends may be fixed through suitable measures such as adhesion or mechanical support so that, for example, they are not damaged by strong Lorentz forces. The inner conductor end 5 may in a preferred embodiment be arranged such that as large as possible a part of the interior of the electric coil 44 remains free as a sample volume.

For the feed-in of a current, the electric coil 44 may additionally comprise contacts not shown here for connecting the coil to an external current source. Furthermore, the electric coil 44 may comprise a heatable area which through heating can be put into a resistively conductive state. Usefully, two contacts are arranged in the region of one of the conductor ends 5 or 6 such that they are arranged on both sides of the heatable area of the coil. An external current can then be fed into the coil via the contacts while the heatable area is, due to the heating, in a resistively conductive state.

The choice of material for the winding support will depend on whether the wound coil remains on the coil support when in operation or whether it is separated from the winding support after winding. In cases in which the coil remains on the winding support, the material of the winding support may comprise for example fiberglass-reinforced plastic, stainless steel, aluminum and/or alloys containing stainless steel and/or aluminum.

Although modifications and changes may be suggested by those skilled in the art, it is the intention of the inventors to embody within the patent warranted hereon all changes and modifications as reasonably and properly come within the scope of their contribution to the art.

We claim as our invention:

1. An electric coil apparatus comprising:
   at least two subcoils made from a superordinate doubly connected tape conductor;
   said tape conductor comprising at least two conductor branches and each of the subcoils being wound around a system axis from one of said conductor branches;
   each of the conductor branches of the superordinate tape conductor having a superordinate first surface and a superordinate second surface facing away from the superordinate first surface;
   in a first subcoil of said at least two subcoils, the first surface of the tape conductor faces a centerpoint of the first subcoil;
   in a second subcoil of said at least two subcoils, the second surface of the tape conductor faces a centerpoint of the second subcoil; and
   the conductor branches of the tape conductor each being arranged with the first and second surfaces thereof at no point forming an angle of 90° to the system axis.

2. The coil apparatus as claimed in claim 1, wherein each of first and second subcoils is a flat disc winding.

3. The coil apparatus as claimed in claim 1, wherein:
   each of first and second the subcoils has a plurality of windings of the respective conductor branches lying on top of one another;
   in the first subcoil, for all windings the first surface of the tape conductor faces the centerpoint of the first subcoil; and
   in the second subcoil, for all windings the second surface of the tape conductor faces a centerpoint of the second subcoil.

4. The coil apparatus claimed in claim 1 comprising:
   a first winding support part and a second winding support part;
   said first and second support parts respectively supporting one of the subcoils; and
   each of said first and second support parts having a slit-shaped recess that receives a first conductor end of the tape conductor.

5. The coil apparatus as claimed in claim 1, wherein the doubly connected tape conductor is a slitted tape conductor having a continuous superconducting layer.

6. The coil apparatus as claimed in claim 5, wherein the continuous superconducting layer comprises a high-temperature superconductor.

7. The coil apparatus as claimed in claim 1, wherein said first and second subcoils are oriented relative to one another to cause magnetic fields generated respectively thereby when a current flows through the common tape conductor, mutually reinforce one another.

8. The coil apparatus as claimed in claim 1, wherein the first and second subcoils each have a plurality of windings of the respective conductor branches lying on top of one another, and wherein an electrically insulating layer is arranged in each case between adjacent windings.

9. The coil apparatus as claimed in claim 1, wherein the conductor branches of the tape conductor have a differing width from one another.

10. An electric coil apparatus comprising:
    at least two subcoils made from a superordinate doubly connected tape conductor;
    said tape conductor comprising at least two conductor branches and each of the subcoils being wound around a system axis from one of said conductor branches;
    each of the conductor branches of the superordinate tape conductor having a superordinate first surface and a superordinate second surface facing away from the superordinate first surface;
    in a first subcoil of said at least two subcoils, the first surface of the tape conductor faces a centerpoint of the first subcoil;
    in a second subcoil of said at least two subcoils, the second surface of the tape conductor faces a centerpoint of the second subcoil; and
    the conductor branches of the tape conductor each being arranged with the first and second surfaces thereof at no point forming an angle of more than 45° to the system axis.

11. The coil apparatus as claimed in claim 10, wherein each of first and second subcoils is a flat disc winding.

12. The coil apparatus as claimed in claim 10, wherein:
    each of first and second the subcoils has a plurality of windings of the respective conductor branches lying on top of one another;
    in the first subcoil, for all windings the first surface of the tape conductor faces the centerpoint of the first subcoil; and
    in the second subcoil, for all windings the second surface of the tape conductor faces a centerpoint of the second subcoil.

13. The coil apparatus claimed in claim 10 comprising:
    a first winding support part and a second winding support part;
    said first and second support parts respectively supporting one of the subcoils; and
    each of said first and second support parts having a slit-shaped recess that receives a first conductor end of the tape conductor.

14. The coil apparatus as claimed in claim 10, wherein the doubly connected tape conductor is a slitted tape conductor having a continuous superconducting layer.

15. The coil apparatus as claimed in claim 14, wherein the continuous superconducting layer comprises a high-temperature superconductor.

16. The coil apparatus as claimed in claim 10, wherein said first and second subcoils are oriented relative to one another to cause magnetic fields generated respectively thereby when a current flows through the common tape conductor, mutually reinforce one another.

17. The coil apparatus as claimed in claim 10, wherein the first and second subcoils each have a plurality of windings of the respective conductor branches lying on top of one another, and wherein an electrically insulating layer is arranged in each case between adjacent windings.

18. The coil apparatus as claimed in claim 10, wherein the conductor branches of the tape conductor have a differing width from one another.

19. An electric coil apparatus comprising:

at least two subcoils made from a superordinate doubly connected tape conductor;

said tape conductor comprising at least two conductor branches and each of the subcoils being wound around a system axis from one of said conductor branches;

each of the conductor branches of the superordinate tape conductor having a superordinate first surface and a superordinate second surface facing away from the superordinate first surface;

in a first subcoil of said at least two subcoils, the first surface of the tape conductor faces a centerpoint of the first subcoil;

in a second subcoil of said at least two subcoils, the second surface of the tape conductor faces a centerpoint of the second subcoil; and the doubly connected tape conductor being divided by more than one slit into more than two conductor branches, each of the conductor branches being respectively wound into one of the at least two subcoils, and at least a pair of said at least two subcoils differing from each other with regard to the orientation of the superordinate surfaces of the tape conductor relative to a centerpoint of the respective subcoil in that pair.

* * * * *